(12) United States Patent
Sun et al.

(10) Patent No.: US 8,552,456 B1
(45) Date of Patent: Oct. 8, 2013

(54) LIGHT-EMITTING DIODE PACKAGING STRUCTURE OF LOW ANGULAR CORRELATED COLOR TEMPERATURE DEVIATION

(75) Inventors: Ching-Cherng Sun, Jhongli (TW); Ching-Yi Chen, Jhongli (TW); Chih-Yu Chiu, Jhongli (TW)

(73) Assignee: National Central University, Jhongli (TW)

( * ) Notice: Subject to any disclaimer, the term of this patent is extended or adjusted under 35 U.S.C. 154(b) by 0 days.

(21) Appl. No.: 13/491,255

(22) Filed: Jun. 7, 2012

(30) Foreign Application Priority Data

Mar. 14, 2012 (TW) .............................. 101108723 A

(51) Int. Cl.
*H01L 33/00* (2010.01)
(52) U.S. Cl.
USPC ... 257/98; 257/100; 257/E33.059; 257/E33.061; 257/E33.068
(58) Field of Classification Search
USPC .................... 257/98, 100, E33.059, E33.061, 257/E33.068
See application file for complete search history.

(56) References Cited

U.S. PATENT DOCUMENTS

2011/0085352 A1\* 4/2011 Ito et al. ..................... 362/617

OTHER PUBLICATIONS

Ching-Cherng Sun et al., "High Uniformity in Angular Correlated-Color-Temperature Distribution of White LEDs from 2800K to 6500K," Optics Express, vol. 20, No. 6, Mar. 12, 2012, pp. 6622-6630.

\* cited by examiner

*Primary Examiner* — Tu-Tu Ho
(74) *Attorney, Agent, or Firm* — Stites & Harbison PLLC; Juan Carlos A. Marquez

(57) ABSTRACT

A light-emitting diode (LED) packaging structure having low angular correlated color temperature deviation includes: a substrate, a LED chip, a phosphor body, and a transparent lens. The LED chip is disposed on the substrate, and the phosphor body includes a hemisphere body and an extension part extended from the bottom of the hemisphere body. The phosphor body is disposed on the substrate and covers the LED chip. Besides, the transparent lens is disposed outside the phosphor body to cover the phosphor body to increase light extraction efficiency. With the implementation of the present invention, the setup of the extension part makes a longer vertical distance between the LED chip and the top of the phosphor body, so that the light in the normal direction of the LED chip can have a longer optical length, thereby to reduce the angular correlated color temperature deviation.

7 Claims, 7 Drawing Sheets

LIGHT-EMITTING DIODE PACKAGING STRUCTURE OF LOW ANGULAR CORRELATED COLOR TEMPERATURE DEVIATION

BACKGROUND OF THE INVENTION

1. Technical Field

The present invention relates to light-emitting diode (LED) packaging structures of low angular correlated color temperature deviation, and more particularly, to a light-emitting diode (LED) packaging structure of low angular correlated color temperature deviation, wherein the LED packaging structure is capable of mixing light uniformly.

2. Description of Related Art

Due to technological advancement, white LED manufacturing methods abound. For example, white light is produced by mixing light with a red LED chip, a green LED chip, and a blue LED chip or by exciting red phosphor materials, green phosphor materials, and blue phosphor materials with an ultraviolet LED chip. At present, the commonest white LED packaging method involves covering the blue LED chip with a phosphor body that contains yellow phosphor materials and exciting yellow phosphor materials with blue light so as to produce white light. Although the aforesaid method is flawed with low optical performance of the white light produced, it is advantageously effective in cutting white LED manufacturing costs.

Referring to FIG. 1, there is shown a cross-sectional view of a conventional LED packaging structure 100 with a reflector 500. The conventional LED packaging structure 100 with the reflector 500 comprises a blue LED chip 200 disposed in the reflector 500. The reflector 500 is coated with and filled with a phosphor body 300 that contains yellow phosphor materials for enclosing the blue LED chip 200. However, since the blue LED chip 200 emits light in a Lambertian emission pattern, not only does it manifest maximum light energy at the zero-angle light in a normal direction, but the light energy decreases as the angle increases, wherein the zero-angle light in the normal direction is the light which is perpendicular to an upper surface of blue LED chip 200. Hence, from the perspective of an angular field, horizontally oriented white light is more likely to be confronted with blue light insufficiency than zero-angle white light in the normal direction is. The light intensity of the zero-degree light in the normal direction emitted from the blue LED chip 200 is higher than the light intensity of light emitted in other directions, and thus zero-angle white light in the normal direction is characterized by surplus blue light.

Referring to FIG. 2, there is shown a graph of correlated color temperature against view angle. From the perspective of the graph of correlated color temperature (CCT) against view angle, since the light intensity of the blue LED chip 200 varies with a view angle, not only does the curvature of the curve in the graph vary greatly with the view angle, but CCT in horizontal orientation is increasingly lower than that in normal direction, wherein the conventional LED packaging structure 100 with the reflector 500 has angular correlated color temperature deviation (ACCTD) of 1500~3000K approximately.

With the conventional LED packaging structure 100 with the reflector 500 having extremely high ACCTD and thus large spatial CCT deviation, the light emitted from the conventional LED packaging structure 100 with the reflector 500 for use with a lamp manifests an apparent yellow halo and a lack of uniformity in light mixing.

Referring to FIG. 3, there is shown a cross-sectional view of a conventional hemisphere LED packaging structure. To solve the aforesaid problem pertaining to overly high ACCTD, the industrial sector developed a hemispherical LED packaging structure 101. The hemispherical LED packaging structure 101 comprises the phosphor body 300 which contains yellow phosphor materials and is shaped like a hemisphere for enclosing the blue LED chip 200. A transparent lens 400 with a hemispherical shape covers the phosphor body 300. The hemispherical LED packaging structure 101 reduces ACCTD to 500~750K approximately, thereby easing the problem of overly high ACCTD slightly and enhancing uniformity in light mixing. Still, an LED packaging structure that ensures high uniformity in light mixing at every angle remains unavailable. Accordingly, it is imperative to reduce the angular correlated color temperature deviation further and efficiently.

SUMMARY OF THE INVENTION

The present invention provides a light-emitting diode (LED) packaging structure of low angular correlated color temperature deviation, comprising a substrate, an LED chip, a phosphor body, and a transparent lens. The LED packaging structure of the present invention further comprises an extension portion of the phosphor body whereby the vertical distance between the LED chip and the top of the phosphor body is lengthened, and enables the light in a normal direction emitted from the LED chip to take a long optical path length, thereby reducing the angular correlated color temperature deviation.

The present invention provides a light-emitting diode (LED) packaging structure of low angular correlated color temperature deviation, comprising: a substrate; an LED chip disposed on the substrate; a phosphor body, comprising: a hemisphere body having a bottom surface; and an extension portion formed by extending from the bottom surface toward the substrate and disposed on the substrate to cover the LED chip; and a transparent lens disposed outside the phosphor body to cover the phosphor body; wherein the bottom surface has a radius of 0.5~5 mm, and an axis of the hemisphere body coincides with a vertical central line of the LED chip, wherein a vertical distance between the bottom surface and an upper surface of the substrate is 0.05~3 mm.

Implementation of the present invention at least involves inventive steps as follows:

1. Reduce the angular correlated color temperature deviation of an LED packaging structure efficiently.

2. Enable the LED packaging structure to mix light uniformly.

The detailed features and advantages of the present invention will be described in detail with reference to the preferred embodiment so as to enable persons skilled in the art to gain insight into the technical disclosure of the present invention, implement the present invention accordingly, and readily understand the objectives and advantages of the present invention by perusal of the contents disclosed in the specification, the claims, and the accompanying drawings.

DETAILED DESCRIPTION OF THE EMBODIMENTS OF THE INVENTION

Figure 1:
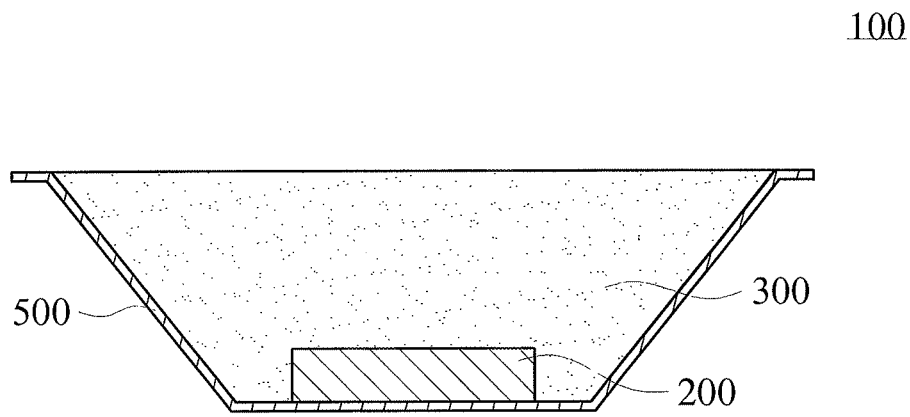
FIG. 1 is a cross-sectional view of a conventional LED packaging structure with a reflector.
Figure 2:
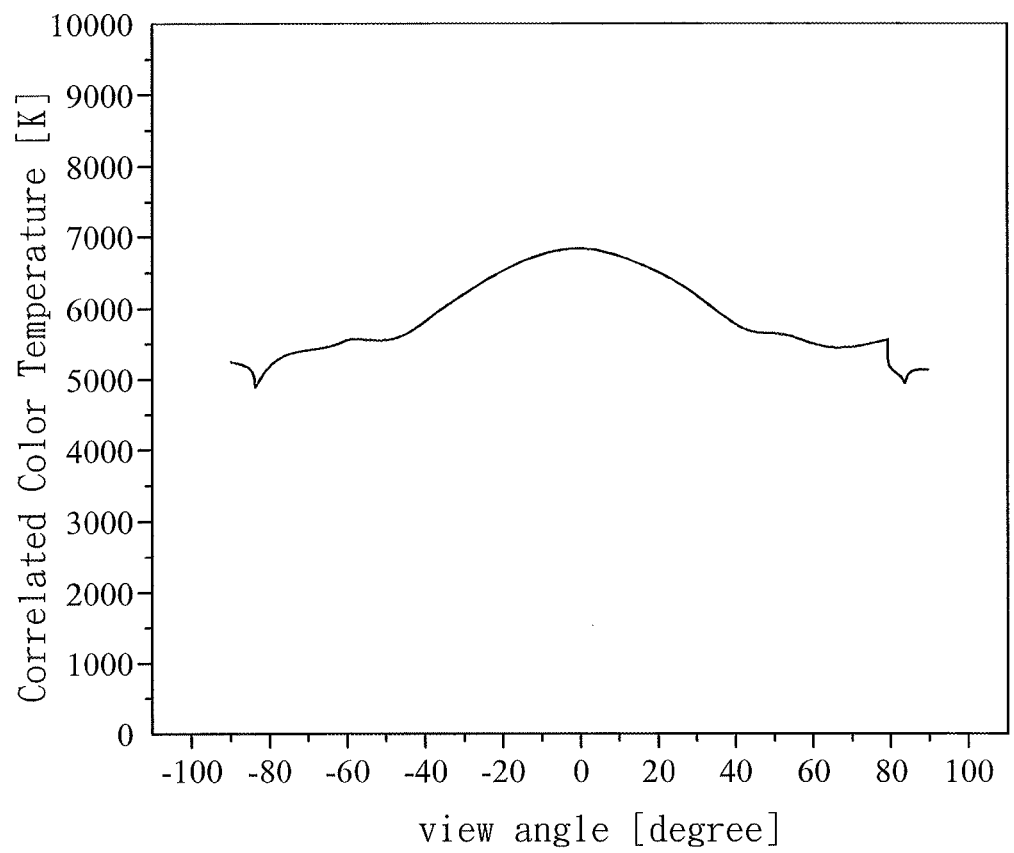
FIG. 2 is a graph of correlated color temperature against view angle.
Figure 3:
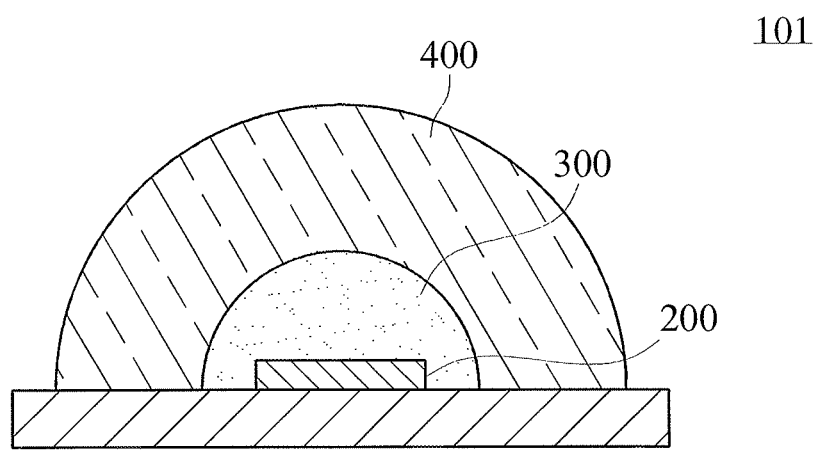
FIG. 3 is a cross-sectional view of a conventional hemisphere LED packaging structure.
Figure 4:
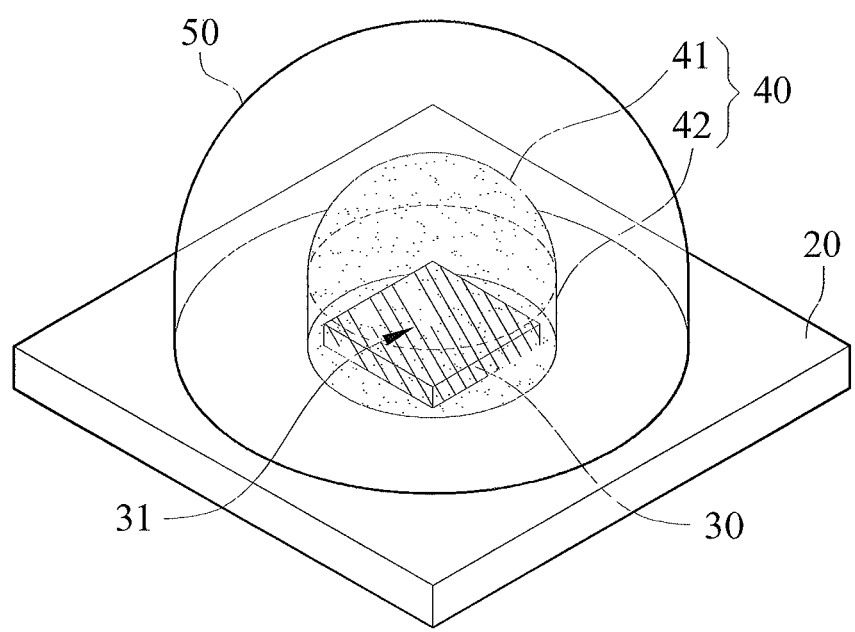
FIG. 4 is a perspective view of an LED packaging structure according to an embodiment of the present invention.
Figure 5:
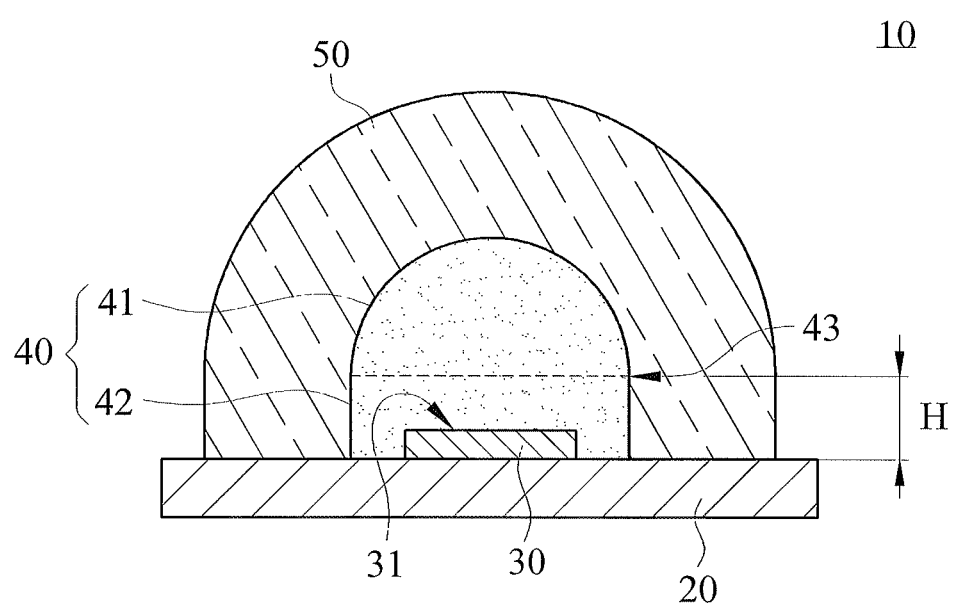
FIG. 5 is a cross-sectional view of an LED packaging structure according to an embodiment of the present invention.

Referring to FIG. 4 and FIG. 5, there are shown a perspective view and a cross-sectional view of a light-emitting diode (LED) packaging structure 10 of low angular correlated color temperature deviation according to an embodiment of the present invention, respectively. The LED packaging structure 10 comprises a substrate 20, an LED chip 30, a phosphor body 40, and a transparent lens 50.

The substrate 20 is a circuit substrate, such as an aluminum circuit substrate, a ceramic circuit substrate, or a PCB circuit substrate. In general, the substrate 20 in wide use is an aluminum circuit substrate or a PCB circuit substrate.

The LED chip 30 has an upper surface 31. The LED chip 30 is mounted on the substrate 20 by a die mounting process. Afterward, in a wire bonding process the LED chip 30 is electrically connected to a circuit structure on the substrate 20 by metal wires (not shown).

The phosphor body 40 is a gel mixture of phosphor materials and silicone gel. The phosphor materials comprises yttrium aluminum garnet (YAG:Ce), silicate, or any material suitable for use in wavelength conversion. The phosphor body 40 comprises a hemisphere body 41 and an extension portion 42. The hemisphere body 41 has a bottom surface 43. The extension portion 42 is formed by extending from the bottom surface 43 of the hemisphere body 41 toward the substrate 20. The extension portion 42 is disposed on the substrate 20 to cover the LED chip 30. Hence, the phosphor body 40 is bullet-shaped. The extension portion 42 raises the hemisphere body 41, so as to increase the vertical distance between the top of the phosphor body 40 and the upper surface 31 of the LED chip 30, thereby increasing the distance between the upper surface 31 of the LED chip 30 and the top of the phosphor body 40. Hence, an optical path length taken by the zero-degree light in the normal direction of the LED chip 30 to reach the top of the phosphor body 40 is lengthened.

To lengthen the optical path length followed by the zero-degree light in the normal direction emitted from the LED chip 30, the vertical central line of the LED chip 30 has to coincide with the axis of the hemisphere body 41. The axis of the hemisphere body 41 is an imaginary line that passes through the center of the bottom surface 43 and is perpendicular to the bottom surface 43. The vertical central line of the LED chip 30 is an imaginary line that passes through the center of the upper surface 31 and is perpendicular to the upper surface 31.

To manufacture the LED packaging structure 10 capable of mixing light to produce white light, it is necessary that the LED packaging structure 10 has the following features: the LED chip 30 is selectively a blue LED chip 30; and the phosphor body 40 covering the blue LED chip 30 contains yellow phosphor materials, such that the blue light emitted from the blue LED chip 30 is absorbed by the yellow phosphor materials and scatters, so as to mix light and produce the white light to be emitted.

The transparent lens 50 is bullet-shaped. The transparent lens 50 is disposed outside the phosphor body 40 and covers the phosphor body 40 to not only protect the LED packaging structure 10 but also increase light extraction efficiency of the LED chip 30. When not covered with the transparent lens 50, the LED packaging structure 10 has a light extraction efficiency of 65%. By contrast, the LED packaging structure 10 covered with the transparent lens 50 has a light extraction efficiency of 67%. The transparent lens 50 is made of glass, epoxy resin, or silicone.

The bottom surface 43 of the hemisphere body 41 has a circular boundary. Given a 0.5~5 mm radius of the bottom surface 43 of the hemisphere body 41 and a 0.05~3 mm vertical distance H between the bottom surface 43 of the hemisphere body 41 and the upper surface of the substrate 20, the LED packaging structure 10 is capable of mixing light uniformly.

Figure 6:
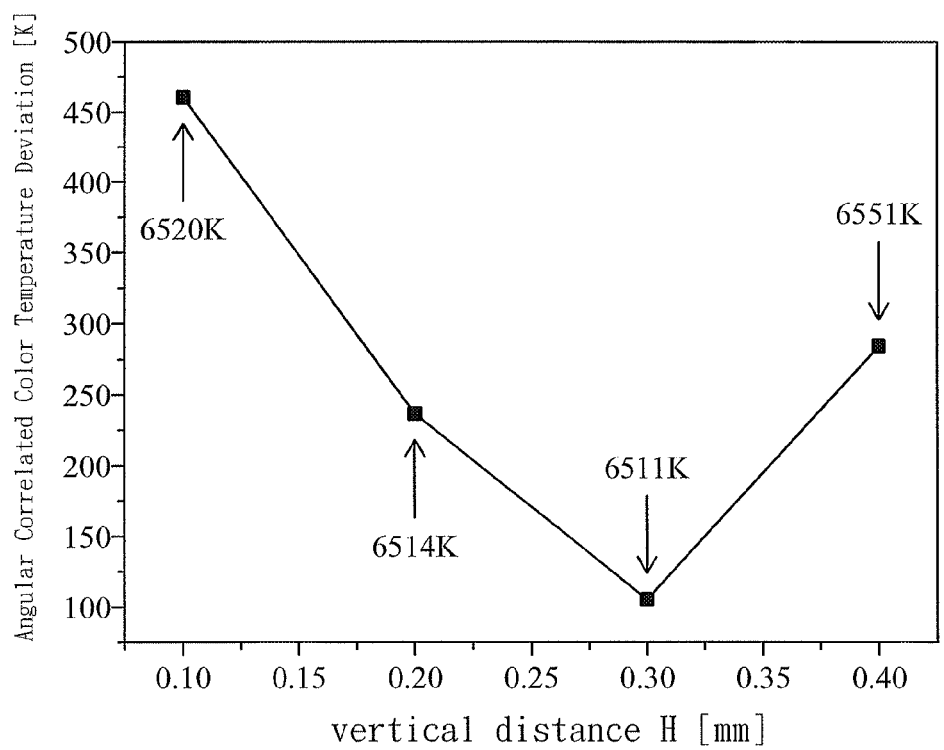
FIG. 6 is a graph of angular correlated color temperature deviation against vertical distance between a bottom surface and an upper surface of a substrate according to an embodiment of the present invention.

Referring to FIG. 5 and FIG. 6, the simulation data indicate: given a 1.5 mm radius of the bottom surface 43 of the hemisphere body 41 and the 0.2 mm vertical distance H between the bottom surface 43 of the hemisphere body 41 and the upper surface of the substrate 20, the color temperature is 6514K, and ACCTD is 237K; and given a 1.5 mm radius of the bottom surface 43 of the hemisphere body 41 and the 0.3 mm vertical distance H between the bottom surface 43 of the hemisphere body 41 and the upper surface of the substrate 20, the color temperature is 6511K, and ACCTD is 105K. Hence, ACCTD is minimized when the vertical distance H between the bottom surface 43 and the substrate 20 is 0.3 mm.

Figure 7:
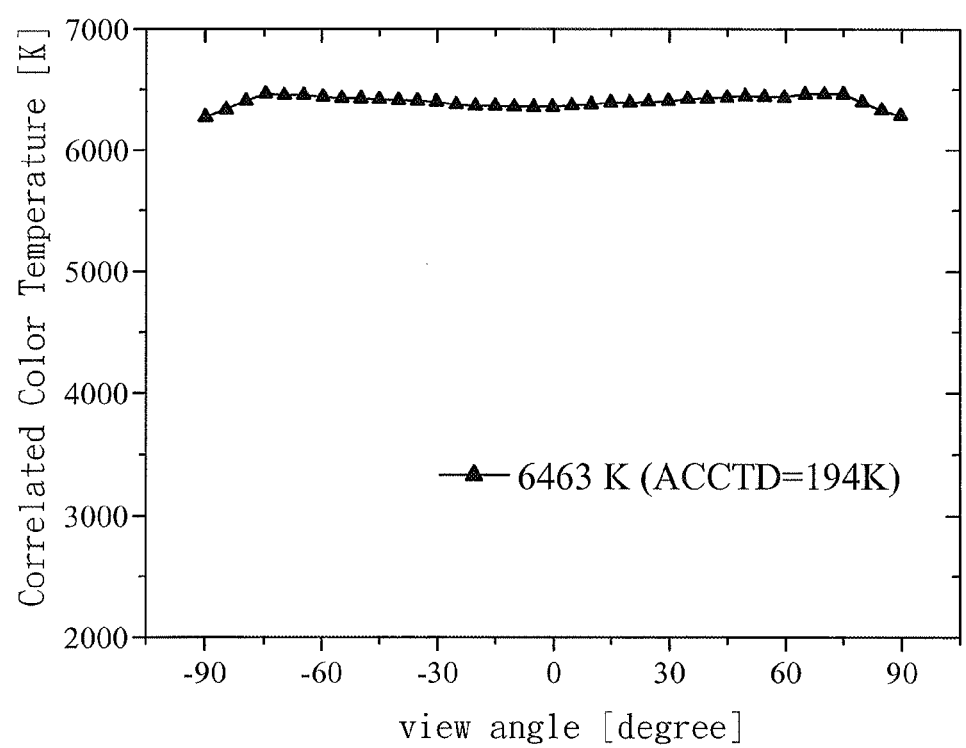
FIG. 7 is a graph of correlated color temperature against view angle according to an embodiment of the present invention.

Referring to FIG. 7, the simulation data indicate: given a 1.5 mm radius of the bottom surface 43 and the vertical distance H of 0.3 mm, the LED packaging structure 10 thus manufactured has CCT of 6463K and ACCTD of just 194K. Hence, with the extension portion 42 lying beneath the hemisphere body 41, CCT approximates 6500K, and ACCTD decreases efficiently.

In this embodiment, the extension portion 42 raises the hemisphere body 41 to thereby lengthen the distance between the upper surface 31 of the LED chip 30 and the top of the phosphor body 40. Hence, an optical path length taken by the light in the normal direction of the LED chip 30 to reach the top of the phosphor body 40 is lengthened. As a result, the light in the normal direction emitted from the LED chip 30 follows a long optical path length through the phosphor body 40, and thus blue light is more likely to be absorbed by the phosphor materials and scattered. Accordingly, the LED packaging structure 10 mixes light uniformly, avoids having too much or too little blue light at a specific angle, reduces the angular correlated color temperature deviation efficiently, and is effective in mixing light.

An otherwise hemispherical package is no longer hemispherical as soon as it is raised. This, coupled with the fact that the manufacturing process for use with the LED packaging structure of the present invention dispenses with any complicated mold, gives the LED packaging structure of the present invention advantages, namely a simple manufacturing process and low manufacturing costs. Furthermore, the LED packaging structure of the present invention advantageously features great reduction in angular correlated color temperature deviation and yellow halo. Accordingly, the LED packaging structure of the present invention has high industrial applicability when applied in the lighting industry and the backlight module industry.

The features of the present invention are disclosed above by the preferred embodiment to allow persons skilled in the art to gain insight into the contents of the present invention and implement the present invention accordingly. The preferred embodiment of the present invention should not be interpreted as restrictive of the scope of the present invention. Hence, all equivalent modifications or amendments made to the aforesaid embodiment should fall within the scope of the appended claims.

What is claimed is:

1. A light-emitting diode (LED) packaging structure of low angular correlated color temperature deviation, comprising:
    a substrate;
    an LED chip disposed on the substrate;
    a phosphor body, comprising:
    a hemisphere body having a bottom surface; and
    an extension portion formed by extending from the bottom surface toward the substrate and disposed on the substrate to cover the LED chip, wherein the surface of the extension portion is perpendicular to the substrate; and
    a transparent lens disposed outside the phosphor body to cover the phosphor body;
        wherein the bottom surface has a radius of 0.5~5 mm, and an axis of the hemisphere body coincides with a vertical central line of the LED chip, wherein a vertical distance between the bottom surface and an upper surface of the substrate is 0.05~3 mm.

2. The LED packaging structure of claim 1, wherein the substrate is one of an aluminum circuit substrate, a ceramic circuit substrate, and a PCB circuit substrate.

3. The LED packaging structure of claim 1, wherein the LED chip is a blue LED chip and the phosphor body contains yellow phosphor materials.

4. The LED packaging structure of claim 1, wherein the bottom surface has a radius of 1.5 mm, and the vertical distance between the bottom surface and the upper surface of the substrate is 0.3 mm.

5. The LED packaging structure of claim 1, wherein the bottom surface has a radius of 1.5 mm, and the vertical distance between the bottom surface and the upper surface of the substrate is 0.2 mm.

6. The LED packaging structure of claim 1, wherein the transparent lens is bullet-shaped.

7. The LED packaging structure of claim 1, wherein the transparent lens is made of glass, epoxy resin, or silicone.

* * * * *